United States Patent [19]
Kalnitsky

[11] Patent Number: 5,589,708
[45] Date of Patent: Dec. 31, 1996

[54] RADIATION HARD INTEGRATED CIRCUITS WITH IMPLANTED SILICON IN GATE OXIDE LAYER, FIELD OXIDE REGION, AND INTERLEVEL DIELECTRIC LAYER

[75] Inventor: Alexander Kalnitsky, Dallas, Tex.

[73] Assignee: SGS-Thomson Microelectronics, Inc., Carrollton, Tex.

[21] Appl. No.: 368,889

[22] Filed: Jan. 5, 1995

Related U.S. Application Data

[62] Division of Ser. No. 905,020, Jun. 26, 1992, Pat. No. 5,418,174.

[51] Int. Cl.$^6$ .................... H01L 23/552; H01L 23/58
[52] U.S. Cl. .................... 257/646; 257/906; 257/921; 257/925
[58] Field of Search .................... 257/646, 925, 257/906, 921

[56] References Cited

U.S. PATENT DOCUMENTS

| | | | |
|---|---|---|---|
| 4,043,024 | 8/1977 | Iwamatsu | 29/571 |
| 4,868,618 | 6/1989 | Kalnitsky et al. | 257/314 |
| 4,934,774 | 6/1990 | Kalnitsky et al. | 385/130 |
| 4,961,103 | 10/1990 | Saitoh et al. | 257/646 |
| 5,035,916 | 7/1991 | Kalnitsky et al. | 427/526 |
| 5,156,994 | 10/1992 | Moslehi | 437/41 |
| 5,168,072 | 12/1992 | Moslehi | 437/44 |
| 5,219,766 | 6/1993 | Fukunaga | 437/24 |

OTHER PUBLICATIONS

Sundaresan, et al., "Rapid–Thermal Nitridation of SiO$_2$ for Radiation–Hardened MOS Gate Dielectrics," IEEE Trans. Nuc. Sci., vol. NS–30, pp. 4141, 1983.

Dunn, G. J., "Hole Trapping in Reoxidized Nitrided Silicon Dioxide," Journal of Applied Physics, vol. 65, No. 12, Jun. 15, 1989, pp. 4879–4883.

Kalnitsky, A., et al. "A Model of Charge Transport in Thermal SiO$_2$ Implanted with Sl," Solid State Electronics, vol. 33, No. 7, pp. 893–905, 1990.

Ramesh, K., et al. "Role of Electron Tapes in the Radiation Hardness of Thermally Nitrided Silicon Dioxide," IEEE, vol. 12, No. 12, Dec. 1991, pp. 658–660.

*Primary Examiner*—Sara W. Crane
*Assistant Examiner*—Alice W. Tang
*Attorney, Agent, or Firm*—Theodore E. Galanthay; Kenneth C. Hill; Lisa K. Jorgenson

[57] ABSTRACT

A method is provided for forming a radiation hard dielectric region of a semiconductor integrated circuit, and an integrated circuit formed according to the same. A field oxide region, a gate oxide layer and an interlevel dielectric layer are formed over the integrated circuit. Silicon ions are implanted separately into the field oxide region, gate oxide layer and interlevel dielectric layer to a sufficient dosage of less than or equal to approximately $1 \times 10^{14}/cm^2$ to form electron traps to capture radiation induced electrons. This method allows for selective enhancement of radiation hardness of a portion of a circuit, thus providing an on-chip "dosimeter" which can be used to compensate the circuit for the loss of performance due to ionizing radiation.

3 Claims, 1 Drawing Sheet

RADIATION HARD INTEGRATED CIRCUITS WITH IMPLANTED SILICON IN GATE OXIDE LAYER, FIELD OXIDE REGION, AND INTERLEVEL DIELECTRIC LAYER

This is a division of application Ser. No. 07/905,020, filed Jun. 26, 1992, now U.S. Pat. No. 5,418,174.

FIELD OF THE INVENTION

The present invention relates generally to semiconductor integrated circuit processing, and more specifically to forming radiation hard integrated circuits.

BACKGROUND OF THE INVENTION

Ionizing radiation is known to produce defects in semiconductors. For example, radiation generates unwanted holes and electrons in gate oxides and other oxide dielectric layers. Throughout the dielectric, radiation generates electron-hole pairs. Some of these electron-hole pairs will recombine while others will not, yielding free electrons and holes. If an irradiated dielectric is a gate oxide, by applying a negative voltage to the gate electrode, the electrons will move toward the substrate and the holes will move toward the gate electrode. If a positive voltage is applied to the gate electrode, the reverse will occur, the electrons will move toward the gate electrode and the holes will move toward the substrate. This movement of and subsequent trapping of electrons and holes on intrinsic trapping sites causes a shift in the threshold voltage due to the radiation. Radiation ultimately induces a build up of positive charge within the dielectric due to large capture cross-sections of hole traps. Various methods have been employed to form radiation hard gate oxides to compensate for the build up of positive charges and to prevent such shifts in the threshold voltage from occurring when the integrated circuit or device is subjected to radiation.

One such method of forming radiation hard gate oxides is to form a nitrided oxide or oxidized nitrided oxide. While no definitive explanation appears to be able to explain all of the observed phenomena for this approach, two plausible explanations exist as to why the oxide becomes radiation hard as more fully described in "Role of Electron Traps in the Radiation Hardness of Thermally Nitrided Silicon Dioxide," by K. Ramesh et al, IEEE Electron Device Letters, Vol. 12, December 1991. One explanation suggests that during nitridation, the oxide is structurally changed which results in fewer hole traps to capture the holes generated by radiation. Another explanation, as further described in "Rapid-Thermal Nitridation of SiO$_2$ for Radiation-Hardened MOS Gate Dielectrics," by R. Sundaresan et al, IEEE Transactions on Nucclear Science, Vol. NS-30, page 4141, 1983, suggests that large electron traps are formed which capture the electrons generated by radiation and compensate for the trapped holes. Additional methods of forming radiation hard dielectrics include gate oxide formation in the presence of steam and gate oxide formation in ultra-dry high temperatures which excludes hydrogen. These method are known to either reduce hole traps or increase electron traps.

Ramesh et al demonstrated that electron trapping does play a significant role in radiation hardness of nitride oxides. This invention describes a new method of forming radiation hard gate oxides and dielectric layers by implanting silicon into the silicon dioxide to increase the number of electron traps.

It is therefore an object of this invention to provide a method of forming radiation hard dielectrics by implanting silicon into silicon dioxide regions.

It is a further object of this invention to provide such a method which utilizes conventional process flows.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby, by forming a dielectric layer over an active area, and implanting silicon into the dielectric layer to a sufficient dosage of less than or equal to approximately $1\times10^{14}/cm^2$ to form electron traps to capture radiation induced electrons.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
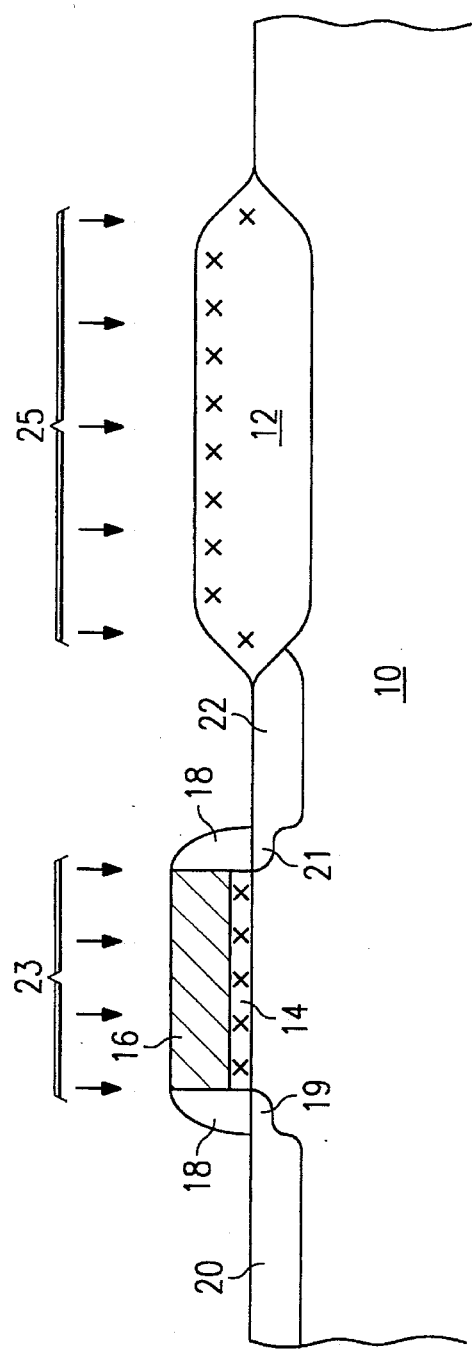
FIGS. 1–2 are cross-sectional views of the fabrication of a semiconductor device structure according to the present invention.

Referring to FIG. 1, a field oxide region 12 is formed over a substrate 10. An oxide layer is formed over the substrate 10 and a polysilicon layer is formed over the oxide layer. The polysilicon layer is patterned and etched to form a gate electrode 16 over a gate oxide layer 14 by conventional process steps. Typically sidewall oxide spacers 18 are formed adjacent to the gate oxide and gate electrode. Lightly doped source and drain regions 19 and 21 and heavily doped source and drain regions 20 and 22 are formed in the substrate also by conventional methods.

A mask is formed (not shown) so that an implant can be made into the gate oxide 14 and field oxide 12 as shown by the arrows 23 and 25. Silicon ions are then implanted into the gate oxide 14 and field oxide 12 as represented by the Xs. The implant should produce a desired density of electron traps with a capture cross section of $1-3\times10^{-18}$ cm$^{-2}$. The density of electron traps will be approximately equal to the density of excess silicon in the silicon dioxide regions after the silicon ions are implanted. Preferably the silicon is implanted to a sufficient dosage of less than or equal to approximately $1\times10^{14}/cm^{-2}$ and having an implant energy level of between approximately 15 to 250 keV. Implanting silicon ions, thus forming electron traps, will enable the gate oxide and field oxide regions to capture radiation-induced electrons. Electron capture will compensate for the positive trapped charges created by radiation or radiation-induced holes. The radiation hardness of each region, the gate oxide and field oxide, can be enhanced by separate implants, shown by 23 and 25, having different doses and energies. This would require a different mask for each implant.

An alternative method of forming the radiation hard gate oxide is to implant the silicon ions before the gate electrode 16 is formed. In this method, it is preferable to anneal the gate oxide in a diluted oxygen gas before gate electrode formation to separate the distribution of the implanted silicon ions from the silicon substrate-silicon dioxide interface. The anneal step will "clean" the interface of the implant-induced surface states. This anneal can be either a furnace anneal or rapid thermal annealing of the gate oxide layer in an oxygen containing ambient.

Figure 2:
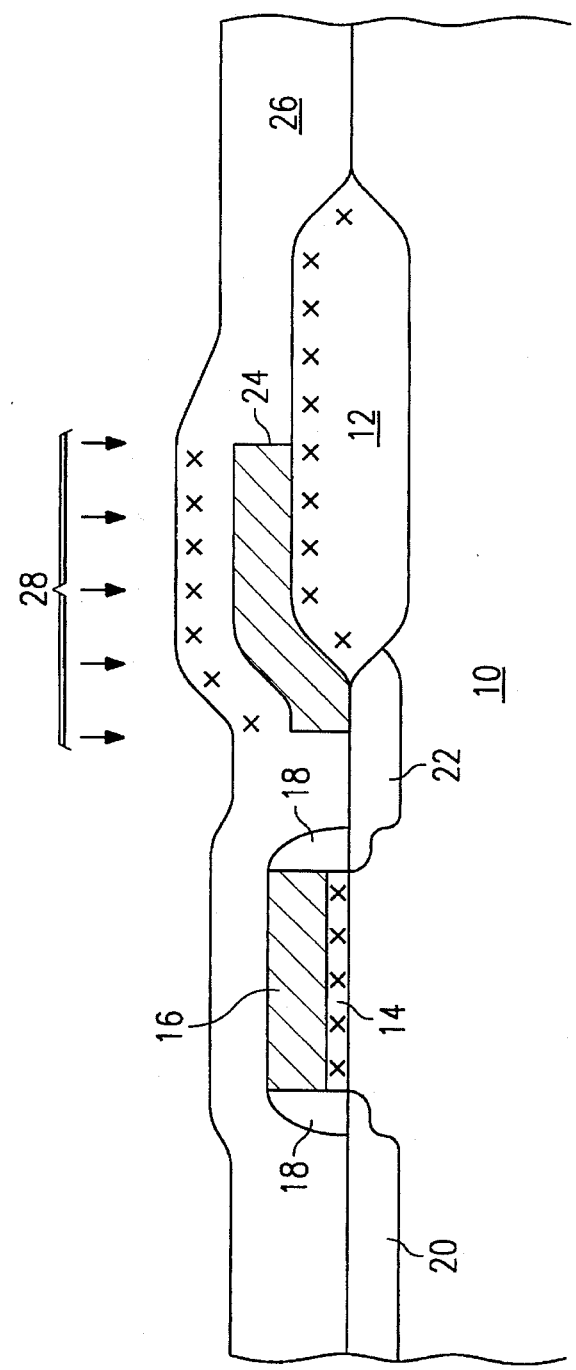

Referring to FIG. 2, a polysilicon layer is formed over the integrated circuit, patterned and etched to form region 24. Region 24 may act as a resistor to connect source/drain region 22 to another conductive region (not shown in the plane of the drawing). Interlevel dielectric layer 26 is formed over the integrated circuit. A mask is formed (not shown) and silicon ions are implanted into the interlevel dielectric layer 26 in the region shown as 28. This implant will form a radiation hard dielectric represented by the Xs in layer 26 over the resistor 24. The formation of electron traps in dielectric 26 will compensate for the radiation-induced holes or positive charge which could effect the performance of the resistor over time.

With the above described method, radiation hard transistors as well as standard transistors can be formed on the same integrated circuit. A different mask may be required to prevent silicon implantation into those transistors which are to remain radiation soft during the implant into the gate oxides. The two different types of transistors will then degrade or recover from the ionizing radiation at different rates. A sensor located on the chip could then determine the difference between the two types of transistors and sense the accumulated dose of radiation. A "self-adapting" circuit could be used to compensate for the loss of performance due to the ionizing radiation. For example, a substrate biasing circuit composed of the two types of transistors could be used to sense the different degradation characteristics of the transistors and a differential signal could then be used to adjust for the radiation-induced loss of performance.

Forming electron traps by implanting silicon ions into the various dielectric regions on the integrated circuit will compensate for the radiation-induced holes or positive charge created by ionizing radiation. Compensating for the positive charge build-up in the gate oxide will reduce threshold voltage shift. Compensating for the positive charge build-up in the field oxide and interlevel dielectric regions will enhance device performance of surrounding devices.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of an integrated circuit, comprising:

an active area;

a plurality of field oxide regions;

a lightly doped polysilicon structure over a portion of the active area and filed oxide regions;

an interlevel dielectric layer disposed over the active area, field oxide regions, and lightly doped polysilicon structure, wherein selected portions of the interlevel dielectric layer have implanted silicon ions of a sufficient dose to form electron traps to capture radiation induced electrons, wherein the dose is less than $1\times10^{14}/cm^2$.

2. The structure of claim 1, wherein the lightly doped polysilicon layer comprises a resistor.

3. A structure consisting of a portion of an integrated circuit, comprising:

a field oxide region disposed over a substrate wherein the field oxide region has implanted silicon ions of a sufficient dose, of less than $1\times10^{14}/cm^2$, to form electron traps to capture radiation induced electrons;

a gate oxide layer disposed over a portion of the substrate wherein the gate oxide layer has implanted silicon ions of a sufficient dose, of less than $1\times10^{14}/cm^2$, to form electron traps to capture radiation induced electrons;

a resistive load device disposed over a portion of the field oxide region and an active area within the substrate; and an interlevel dielectric layer disposed over the resistive load device and active area wherein the interlevel dielectric has implanted silicon ions of a sufficient dose, of less than $1\times10^{14}/cm^2$, to form electron traps to capture radiation induced electrons.

\* \* \* \* \*